United States Patent
Su et al.

(10) Patent No.: US 7,436,640 B2
(45) Date of Patent: Oct. 14, 2008

(54) BOOSTER POWER MANAGEMENT INTEGRATED CIRCUIT CHIP WITH ESD PROTECTION BETWEEN OUTPUT PADS THEREOF

(76) Inventors: Hung-Der Su, No. 143, Tan-Chien Rd., She-Chung Tsun, Lu-Chu Hsiang, Kaohsiung Hsien (TW); Jing-Meng Liu, 6F-1, No. 15, Lane 145, Pao-Shan Rd., Hsin-Chu (TW); Chiang-Yung Ku, 10F, No. 23, Alley 16, Lane 354, Sec. 1, Kuang-Fu Rd., Hsin-Chu (TW)

( * ) Notice: Subject to any disclaimer, the term of this patent is extended or adjusted under 35 U.S.C. 154(b) by 403 days.

(21) Appl. No.: 11/154,175

(22) Filed: Jun. 15, 2005

(65) Prior Publication Data

US 2006/0126237 A1    Jun. 15, 2006

(30) Foreign Application Priority Data

Dec. 10, 2004    (TW) .............................. 93138396 A

(51) Int. Cl.
    *H02H 9/00*    (2006.01)
(52) U.S. Cl. ....................................................... 361/56
(58) Field of Classification Search .................... 361/56
    See application file for complete search history.

(56) References Cited

U.S. PATENT DOCUMENTS

| | | | | |
|---|---|---|---|---|
| 5,463,520 | A | * | 10/1995 | Nelson ......................... 361/56 |
| 7,102,862 | B1 | * | 9/2006 | Lien et al. ...................... 361/56 |
| 2005/0057866 | A1 | * | 3/2005 | Mergens et al. ............... 361/56 |

* cited by examiner

*Primary Examiner*—Michael J Sherry
*Assistant Examiner*—Christopher J Clark
(74) *Attorney, Agent, or Firm*—Quine Intellectual Property Law Group; Gary Baker

(57) ABSTRACT

A booster power management integrated circuit chip includes first and second output pads, a transistor switch coupled between the first and second output pads and having a gate, and a trigger circuit coupled between the first and second output pads and further coupled to the gate of the transistor switch. The trigger circuit drives the transistor switch to conduct when an instantaneous voltage larger than a trigger voltage level is present between the first and second output pads so as to enable electric current to flow through the transistor switch.

9 Claims, 8 Drawing Sheets

US 7,436,640 B2

BOOSTER POWER MANAGEMENT INTEGRATED CIRCUIT CHIP WITH ESD PROTECTION BETWEEN OUTPUT PADS THEREOF

CROSS-REFERENCE TO RELATED APPLICATION

This application claims priority of Taiwanese application no. 093138396, filed on Dec. 10, 2004.

BACKGROUND OF THE INVENTION

1. Field of the Invention

The invention relates to a booster power management integrated chip, more particularly to a booster power management integrated circuit chip that includes an electrostatic discharge (ESD) protection mechanism.

2. Description of the Related Art

Static electricity is always present in our surrounding environment. In particular, when an object that carries static electricity comes into contact with a terminal of an integrated circuit chip, an instantaneous high voltage discharge can have an adverse affect on electric circuits connected to that terminal. This phenomenon, which is known as electrostatic discharge (abbreviated as ESD), is one of the most common causes of failure in electronic systems.

As shown in FIG. 1, a conventional ESD protection circuit 1 is embedded in an integrated circuit chip 2 having a pair of pads 20, 21. The ESD protection circuit 1 is coupled between the pads 20, 21 of the integrated circuit chip 2 so as to protect an electric circuit that is also coupled between the pads 20, 21 from possible damage due to ESD. The conventional ESD protection circuit 1 includes an ESD component 11 (such as a NMOS transistor), a voltage drop circuit 12 coupled between the pad 20 and a gate of the ESD component 11, and a resistor 13 coupled between the gate of the ESD component 11 and the pad 21.

The voltage drop circuit 12 includes a plurality of MOS transistors 121 that are connected in series. Under normal operating conditions, since the output voltage between the pads 20, 21 is lower than a trigger voltage level, the ESD component 11 is unable to conduct. The trigger voltage level is the sum of the lowest drive voltage for the voltage drop circuit 12 and the lowest conduction threshold voltage of the ESD component 11.

On the other hand, when ESD is present between the pads 20, 21, if an instantaneous voltage attributed to the ESD is larger than the trigger voltage level, the ESD component 11 will conduct such that electric current will be able to flow therethrough. As a result, a large portion of the high electric current attributed to the ESD can be diverted to protect the electric circuit 3 from damage.

In general, the ESD component 11 (in this instance, a NMOS transistor) has a channel width of only about 400 µm such that the channel resistance thereof is about 20 ohms. With reference to FIG. 2, the instantaneous high electric current attributed to the ESD will generate a high voltage across the channel resistance that can cause a parasitic bipolar junction transistor (abbreviated as BJT) 110 of the ESD component 11 to conduct. As a result, both the BJT 110 and the channel of the ESD component 11 conduct current and share the load of the ESD current. However, when the BJT 110 conducts, it has a non-uniform characteristic in that higher temperatures can cause higher electric current concentration. Hence, a large portion of the ESD current will concentrate at the BJT 110, which is the first to conduct, such that the ESD component 11 is prone to burn out due to localized overheating as a result of a high electric current density through the BJT 110.

In view of the above, it has been proposed heretofore to add a series resistance 14 (see FIG. 3) in the ESD component 11 to eliminate the temperature effect of the BJT 110 and to achieve an effect of greater current dispersion for higher temperatures, thereby protecting the ESD component 11 from damage due to localized overheating. Nevertheless, this results in an increased component area for the ESD component 11.

Referring to FIG. 4, a conventional booster (or boost converter) 4 is used to boost an input voltage (Vin) provided by a power management integrated circuit chip 5 to a higher level for subsequent output. The power management integrated circuit chip 5 includes a MOS transistor switch 41 (in this instance, a NMOS transistor) coupled between first and second output pads 51, 52. Aside from the integrated circuit chip 5, the booster 4 further includes an inductor 42 for coupling the input voltage (Vin) to the first output pad 51, a diode 44 connected to the first output pad 51, and a capacitor 43 coupled between the diode 44 and the second output pad 52.

The MOS transistor switch 41 has a gate coupled to a control circuit 45. When the MOS transistor switch 41 is turned on in response to control activity of the control circuit 45, the inductor 42 is charged by the input voltage (Vin). When the MOS transistor switch 41 is turned off in response to control activity of the control circuit 45, the inductor 42 charges the capacitor 43 through the diode 44. As a result, electric energy is transferred to the capacitor 43 for storage such that the output voltage (Vout) from the capacitor 43 will be higher than the input voltage (Vin), thereby achieving a voltage boosting effect.

It is noted that the conventional booster 4 does not incorporate an ESD protection mechanism in view of the following: In view of circuit size considerations, it is not possible to add a sufficiently large series resistance in the MOS transistor switch 41 so as to eliminate the temperature effect of a parasitic BJT. Moreover, the conduction voltage of the parasitic BJT is not larger than that of the parasitic BJT of the ESD component 11 in FIG. 1. If the conventional ESD protection circuit 1 of FIG. 1 is to be added into the booster 4, the resulting circuit will be that shown in FIG. 5, in which a resistor 46 must be coupled between a drain of the MOS transistor switch 41 and the ESD protection circuit 1 such that the ESD voltage will not directly harm the MOS transistor switch 41. However, the resistor 46 will affect the output voltage of the booster 4, thereby adversely affecting operating efficiency of the booster 4.

Furthermore, since the channel of the MOS transistor switch 41 in the conventional booster 4 would not open during the occurrence of ESD, only the parasitic BJT is available to eliminate static electricity. However, in view of circuit size considerations, it is not possible to add a sufficiently large series resistance for the parasitic BJT. As a result, the MOS transistor switch 41 is prone to burn out due to the heat concentration effect of the electric currents generated during the occurrence of ESD.

SUMMARY OF THE INVENTION

Therefore, the object of the present invention is to provide a booster power management integrated circuit chip that includes an electrostatic discharge (ESD) protection mechanism for overcoming the aforesaid drawbacks of the prior art.

Accordingly, a booster power management integrated circuit chip of this invention comprises first and second output pads, a transistor switch coupled between the first and second output pads and having a gate, and a trigger circuit coupled between the first and second output pads and further coupled to the gate of the transistor switch. The trigger circuit drives the transistor switch to conduct when an instantaneous voltage larger than a trigger voltage level is present between the first and second output pads so as to enable electric current to flow through the transistor switch.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
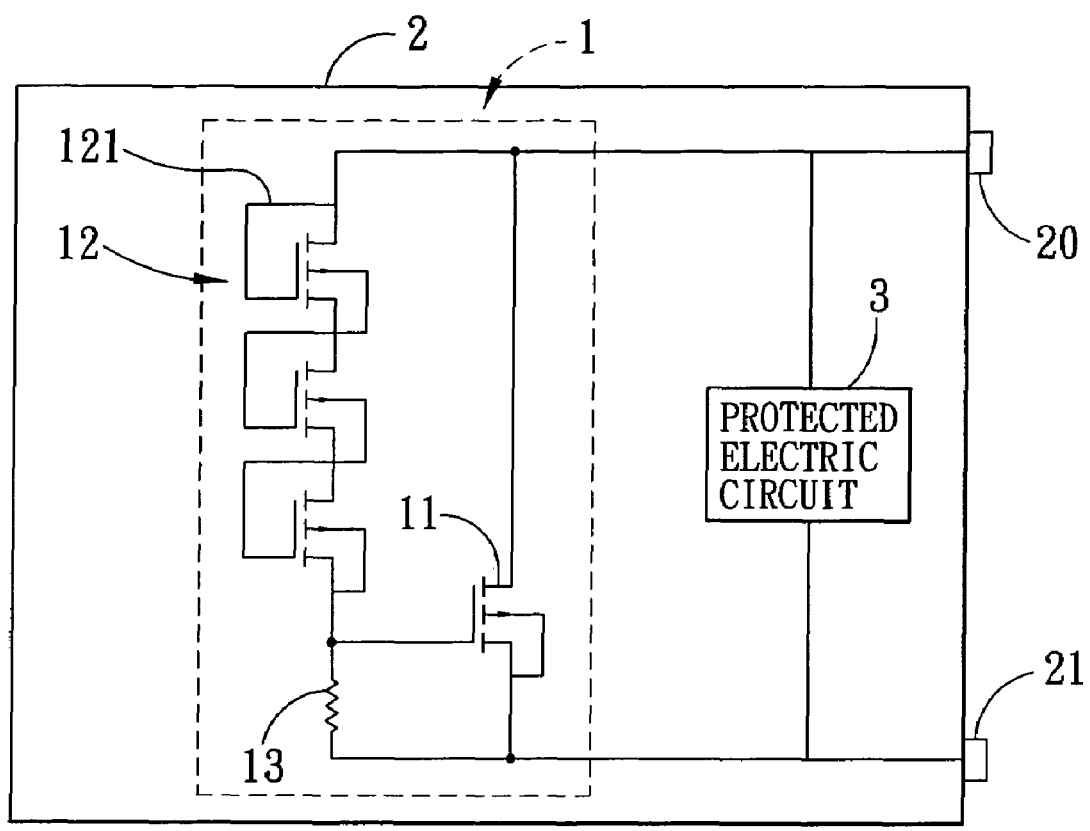
FIG. 1 is a circuit diagram of a conventional ESD protection circuit in an integrated circuit chip.
Figure 2:
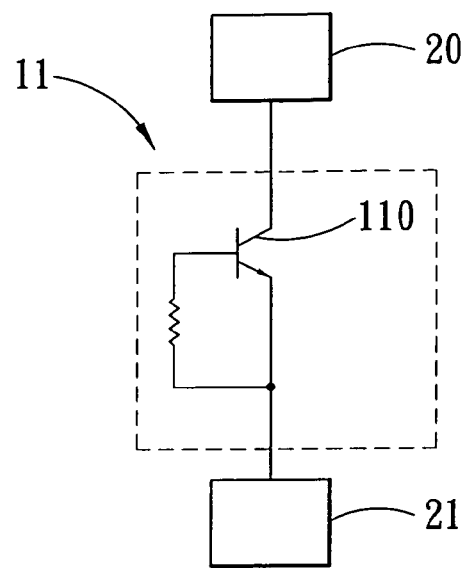
FIG. 2 is a circuit diagram to illustrate a parasitic BJT inside an ESD component of the ESD protection circuit of FIG. 1.
Figure 3:
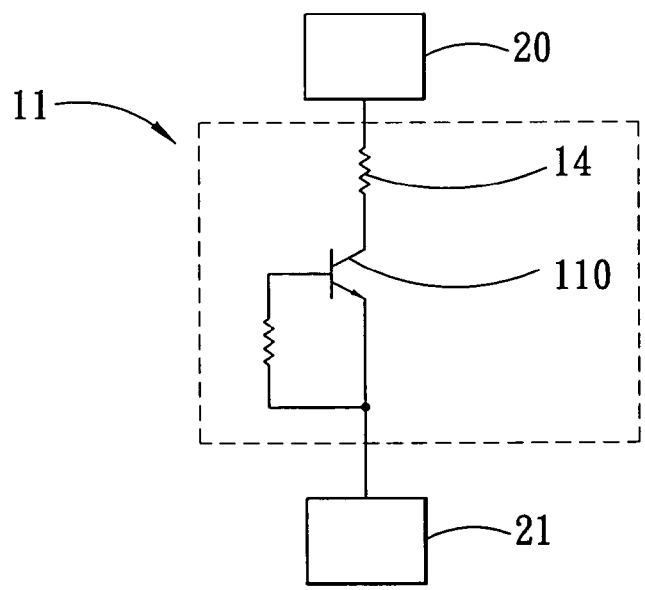
FIG. 3 is a circuit diagram similar to FIG. 2, but further illustrating a series resistance inside the ESD component.

Before the present invention is described in greater detail with reference to the accompanying preferred embodiments, it should be noted herein that like elements are denoted by the same reference numerals throughout the disclosure.

Figure 4:
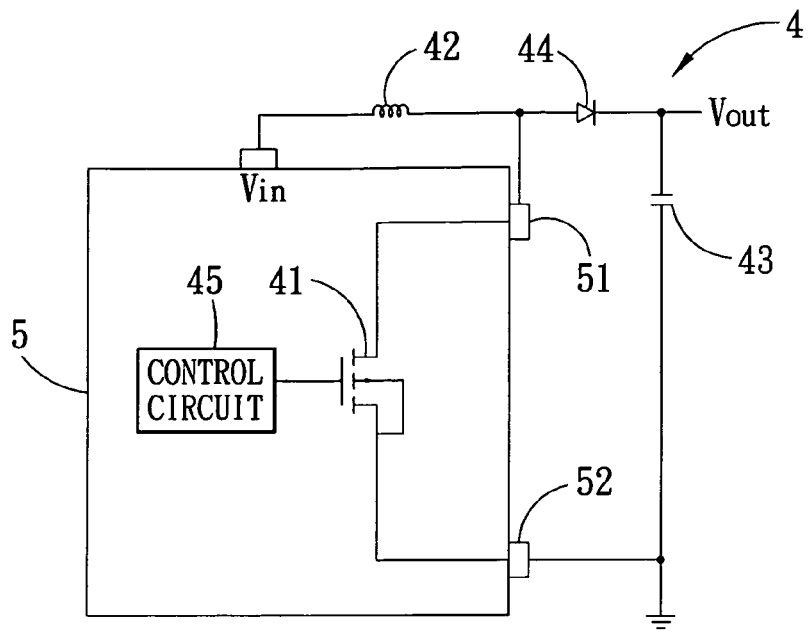
FIG. 4 is a circuit diagram of a conventional booster.
Figure 5:
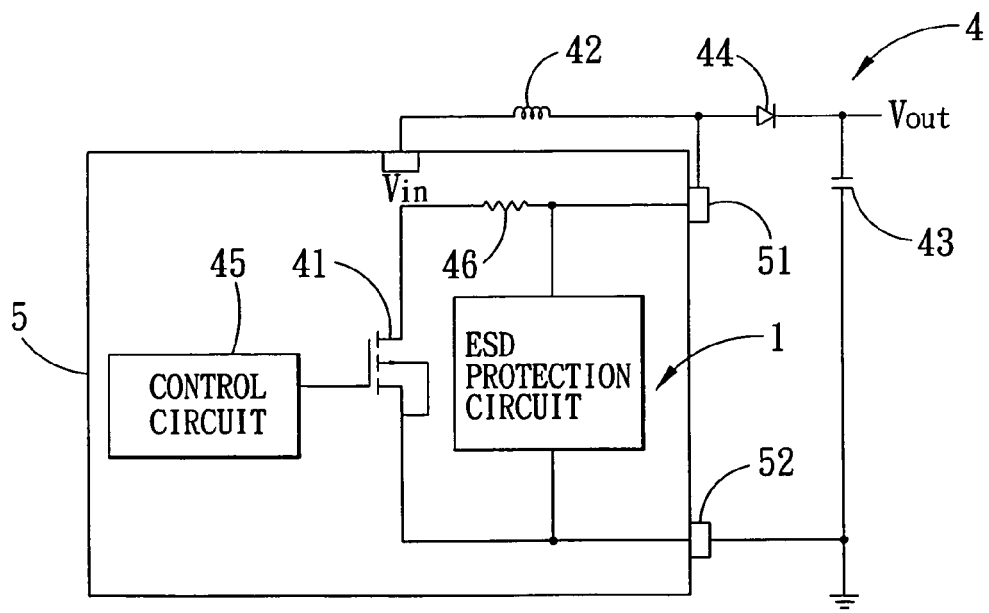
FIG. 5 is a circuit diagram illustrating a conventional booster modified from that shown in FIG. 4 by adding a resistor and an ESD protection circuit in a power management integrated circuit chip of the booster.
Figure 6:
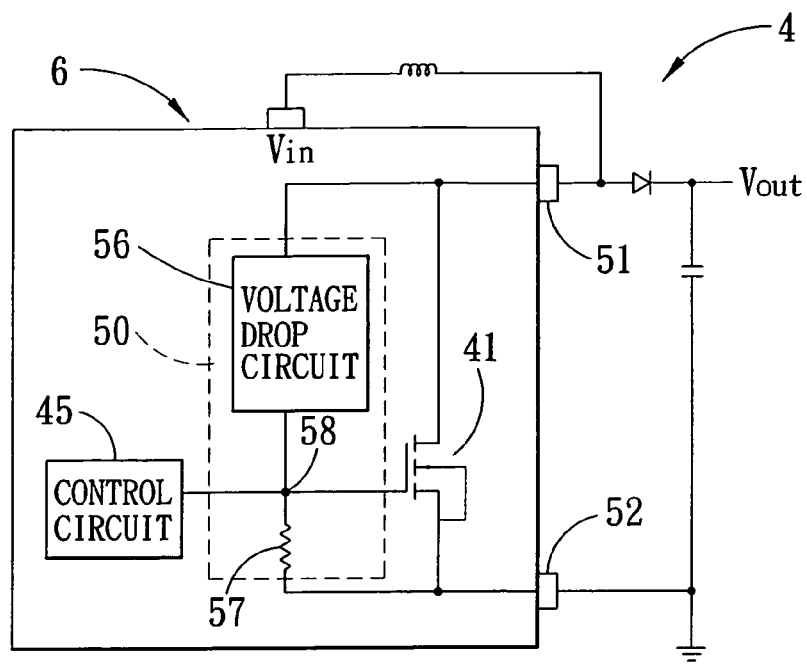
FIG. 6 is a circuit diagram illustrating a preferred embodiment of a booster power management integrated circuit chip according to the present invention.

Referring to FIG. 6, the preferred embodiment of a booster power management integrated circuit chip 6 with an ESD protection mechanism of this invention is applied in a booster (or boost converter) 4. Aside from the components of the conventional power management integrated circuit chip 5 shown in FIG. 4, the power management integrated circuit chip 6 of this invention further includes a trigger circuit 50 coupled between first and second output pads 51, 52, and is further coupled to a gate of MOS transistor switch 41. When an instantaneous voltage (e.g. due to ESD) larger than a trigger voltage level is present between the first and second output pads 51, 52, the trigger circuit 50 will drive the MOS transistor switch 41 to conduct so as to enable electric current to flow uniformly through the channel of the MOS transistor switch 41 so that the MOS transistor switch 41 coupled between the first and second output pads 51, 52 may be protected from damage due to the instantaneous high voltage.

Figure 7:
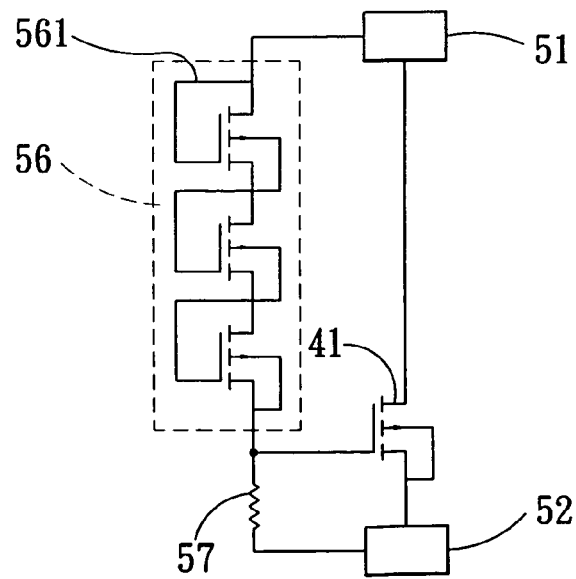
FIG. 7 is a circuit diagram to illustrate a preferred implementation of a voltage drop circuit in the embodiment of FIG. 6.
Figure 8:
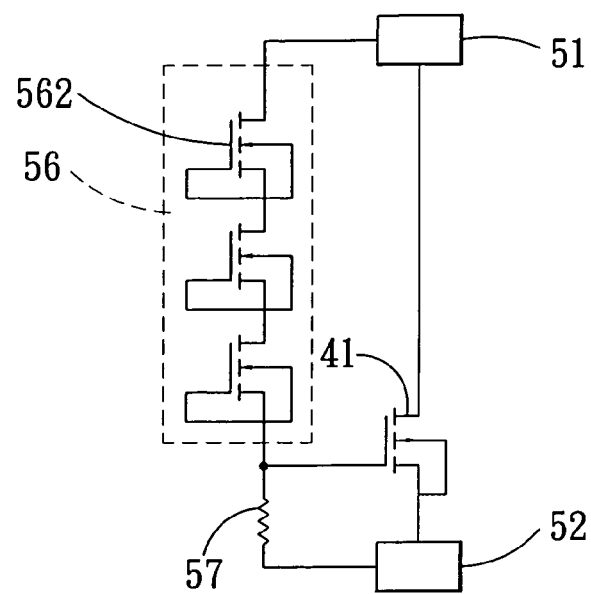
FIG. 8 is a circuit diagram to illustrate another preferred implementation of the voltage drop circuit in the embodiment of FIG. 6.

In this embodiment, the trigger circuit 50 includes a resistor 57 and a voltage drop circuit 56. The resistor 57 is coupled between the second output pad 52 and the gate of the MOS transistor switch 41. The voltage drop circuit 56 is coupled between the first output pad 51 and the gate of the MOS transistor switch 41 so as to generate a conduction threshold voltage therebetween. It is noted that the trigger voltage level is not less than a sum of the conduction threshold voltage and a gate threshold voltage for causing the MOS transistor switch 41 to conduct. Moreover, as shown in FIGS. 7 and 8, the voltage drop circuit 56 includes a plurality of transistors that are connected in series such that the conduction threshold voltage is a gate threshold voltage for causing the transistors of the voltage drop circuit 56 to conduct. In FIG. 7, the transistors of the voltage drop circuit 56 are N-channel metal-oxide-semiconductor (NMOS) transistors 561. In FIG. 8, the transistors of the voltage drop circuit 56 are P-channel metal-oxide-semiconductor (PMOS) transistors 562. Therefore, the conduction threshold voltage can be adjusted by varying the number of the transistors 561 or 562 of the voltage drop circuit 56. For instance, assumed that the voltage (Vout) of the booster 4 is about 20 volts, the conduction threshold voltage can be set to 25 volts. In this manner, since the voltage (Vout) under normal operating conditions is lower than the trigger voltage level, the trigger circuit 50 is unable to trigger conduction of the MOS transistor switch 41 under the normal operating conditions.

On the other hand, when an instantaneous voltage larger than the trigger voltage level, for instance, 27 volts, is present between the first and second output pads 51, 52 due to ESD, a voltage drop of 2 volts will be generated at a junction node 58 (see FIG. 6) of the voltage drop circuit 56, the resistor 57 and the MOS transistor switch 41. Hence, assuming that the gate threshold voltage of the MOS transistor switch 41 is 1 volt, the MOS transistor switch 41 will be driven to conduct so as to enable electric currents to flow uniformly through the MOS transistor switch 41 and to the second output pad 52.

Preferably, the MOS transistor switch 41 is a NMOS transistor that has a wide channel width, i.e., larger than 10000 μm. Therefore, the channel resistance associated therewith is relatively small, i.e., smaller than 1 ohm. As such, the voltage drop attributed to the electric current flowing through the channel resistance is insufficient to drive the parasitic BJT (not shown) in the MOS transistor switch 41 to conduct. Moreover, when the MOS transistor switch 41 conducts, since the MOS transistor switch 41 has a uniform characteristic of higher temperatures resulting in greater dispersion of electric current, the electric current can be dispersed more uniformly throughout the entire channel, such that the MOS transistor switch 41 can be protected from damage that is attributed to overheating due to localized concentration of the electric current.

Figure 9:
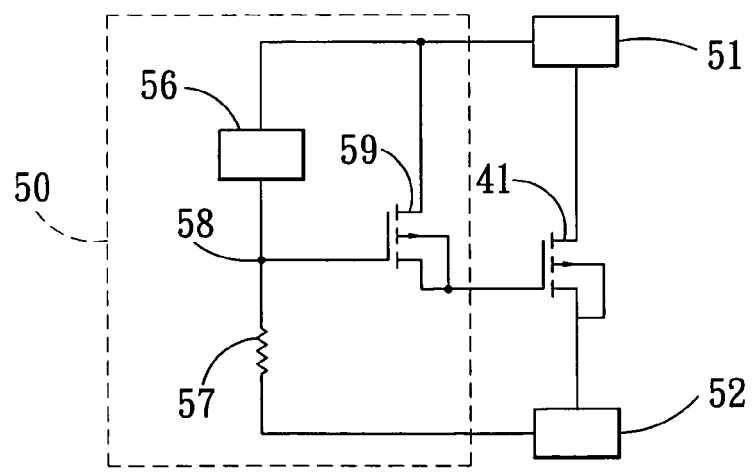
FIG. 9 is a circuit diagram to illustrate a modified trigger circuit for the embodiment of FIG. 6.

Referring to FIG. 9, in order to shorten response time of the MOS transistor switch 41, the trigger circuit 50 further includes a NMOS transistor 59 having a drain coupled to the first output pad 51, a gate coupled to the junction node 58 of the voltage drop circuit 56 and the resistor 57, and a source coupled to the gate of the MOS transistor switch 41. In this manner, the NMOS transistor 59 conducts so as to trigger conduction of the MOS transistor switch 41 when the instantaneous voltage larger than the trigger voltage level is present between the first and second output pads 51, 52 in order to shorten the response time of the MOS transistor switch 41.

Figure 10:
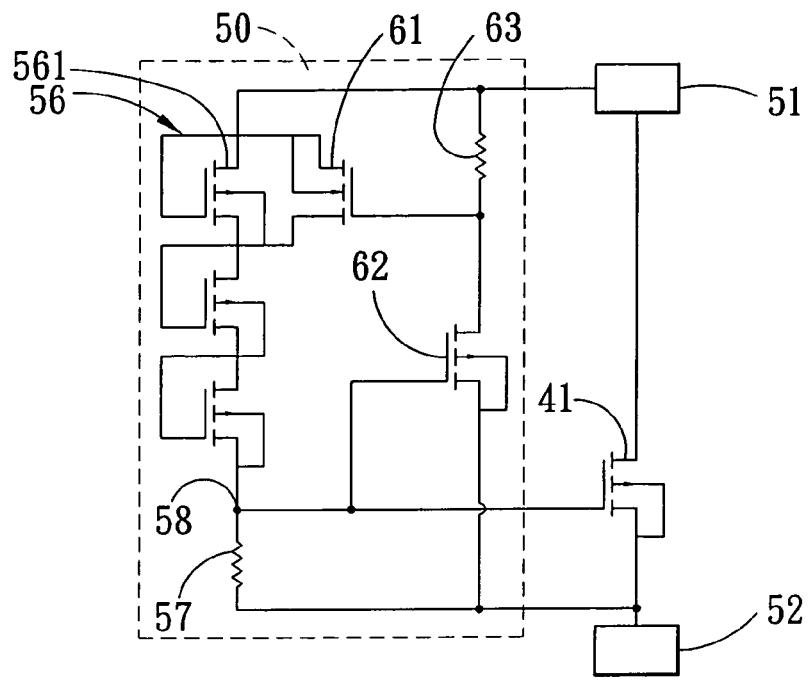
FIG. 10 is a circuit diagram to illustrate another modified trigger circuit for the embodiment of FIG. 6.

Referring to FIG. 10, in order to ensure that the MOS transistor switch 41 is not switched off when the voltage between the first and second output pads 51, 52 drops slightly lower than the trigger voltage level so as to lengthen the ESD protection period, the voltage drop circuit 56 of this embodiment further includes a magnetic hysteresis control circuit that includes a first transistor 61, a second transistor 62 and a resistor 63. The first transistor 61 is coupled in parallel to one of the MOS transistors 561 of the voltage drop circuit 56 (in this embodiment, the first one of the MOS transistors 561 of the voltage drop circuit 56), and has a gate. The second transistor 62 has a drain coupled to the gate of the first transistor 61, a gate coupled to the gate of the MOS transistor switch 41, and a source coupled to the second output pad 52. The resistor 63 is coupled between the first output pad 51 and the gate of the first transistor 61. In this embodiment, the first transistor 61 is a PMOS transistor, and the second transistor 62 is a NMOS transistor. When the instantaneous voltage larger than the trigger voltage level is present between the first and second output pads 51, 52, the second transistor 62 conducts and causes the first transistor 61 to conduct, thereby short-circuiting said one of the MOS transistors 561 of the voltage drop circuit 56 so as to ensure that the MOS transistor switch 41 is switched off only when the voltage between the first and second output pads 51, 52 is lower than another voltage level, for instance, 23 volts, which is set to be lower than the trigger voltage level. In this manner, the conducting period of the MOS transistor switch 41 is lengthened.

Figure 11:
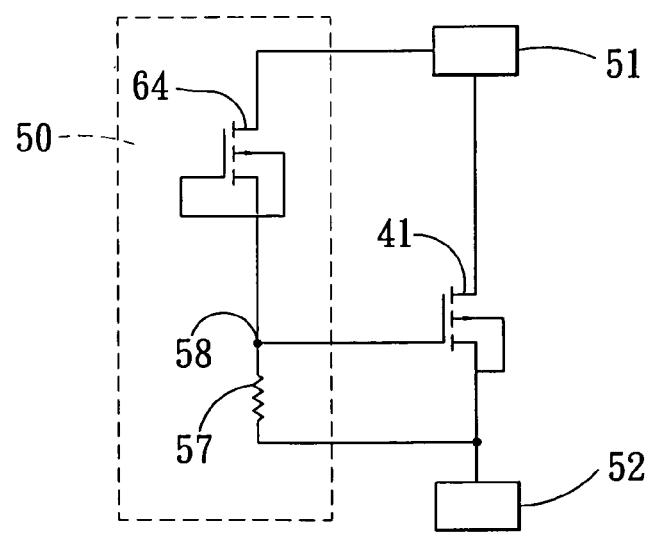
FIG. 11 is a circuit diagram to illustrate yet another modified trigger circuit for the embodiment of FIG. 6.

As shown in FIG. 11, the voltage drop circuit 56 of the trigger circuit 50 in the previous embodiments may be replaced by a NMOS transistor 64 having a breakdown voltage lower than that of the MOS transistor switch 41. In this embodiment, the trigger voltage level is not less than a sum of the breakdown voltage and the gate threshold voltage of the transistor switch 41. In this manner, when an instantaneous voltage larger than the trigger voltage level is present between the first and second output pads 51, 52, the NMOS transistor 64 breaks down, such that the voltage drop attributed to the electric current flowing through the resistor 57 drives the MOS transistor switch 41 to conduct.

Figure 12:
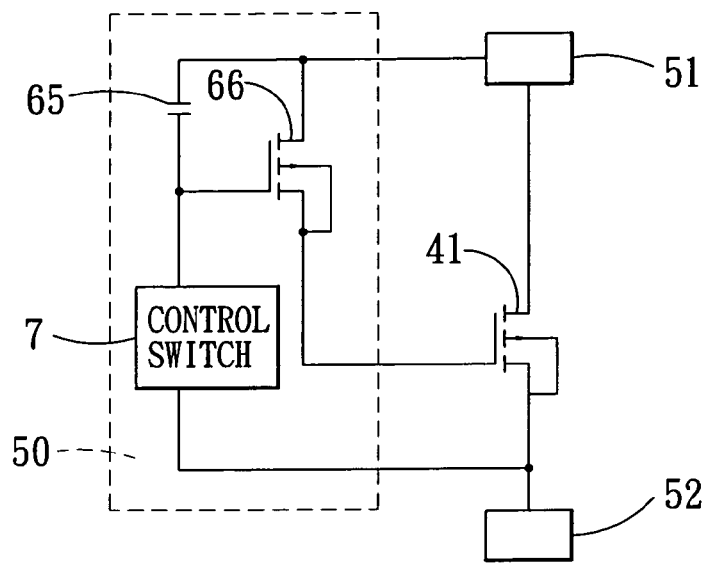
FIG. 12 is a circuit diagram to illustrate still another modified trigger circuit for the embodiment of FIG. 6.

Referring to FIG. 12, the trigger circuit 50 of this embodiment is shown to include a first transistor 66, a first capacitor 65, and a control circuit 7. The first transistor 66, which is a NMOS transistor in this embodiment, includes agate, a drain coupled to the first output pad 51, and a source coupled to the gate of the MOS transistor switch 41. The first capacitor 65 is coupled between the first output pad 51 and the gate of the first transistor 66. The control switch 7 is coupled between the second output pad 52 and the gate of the first transistor 66. The capacitance of the first capacitor 65 is far larger than that between the gate and the drain of the first transistor 66 and the MOS transistor switch 41. In this embodiment, the control switch 7 forms a closed circuit under normal operating conditions for allowing the first capacitor 65 to charge and for preventing the first transistor 66 from conducting. On the other hand, the presence of the instantaneous voltage between the first and second output pads 51, 52 upon occurrence of ESD opens the control circuit 7. In view of inability of the voltage state of the first capacitor 65 to change instantaneously, the gate-source voltage (Vgs) of the first transistor 66 increases, which causes the first transistor 66 to conduct, thereby triggering conduction of the MOS transistor switch 41. As a result, electric current attributed to the ESD can flow uniformly through the MOS transistor switch 41.

Figure 13:
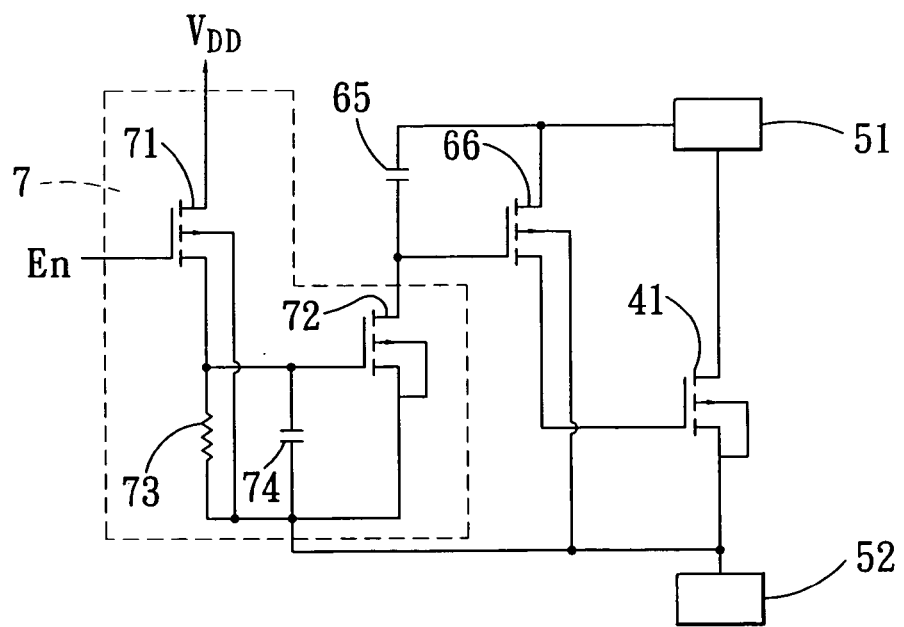
FIG. 13 is a circuit diagram to illustrate a control switch in the embodiment of FIG. 12 in greater detail.

Referring to FIG. 13, the control switch 7 is shown to include a second transistor 71, a third transistor 72, and a resistor 73. The second transistor 71, which is a NMOS transistor in this embodiment, includes a drain that receives a supply voltage ($V_{DD}$), a source, and a gate for receiving an enable signal (En) such that the second transistor 71 can be turned on or off in response thereto, i.e., the state of the second transistor 71 depends upon the enable signal (En). The third transistor 72, which is also a NMOS transistor in this embodiment, has a gate coupled to the source of the second transistor 71, a drain coupled to the gate of the first transistor 66, and a source. The resistor 73 is coupled between the source and the gate of the third transistor 72. In this embodiment, in an activated state of the booster, the second transistor 71 can be triggered into conduction through the enable signal (EN), and a voltage drop across the resistor 73 for causing the third transistor 72 to conduct can be generated accordingly, thereby preventing the first transistor 66 from conducting under the normal operating conditions.

Preferably, the control switch 7 further includes a second capacitor (or decoupling capacitor) 74 coupled between the gate of the third transistor 72 and the second output pad 52. The capacitance of the second capacitor 74 is far larger than that between the gate and the source of the third transistor 72 so as to stabilize the gate-source voltage of the third transistor 72 and prevent shut down of the third transistor 72 due to voltage fluctuation between the first and second output pads 51, 52 under the normal operating conditions.

Figure 14:
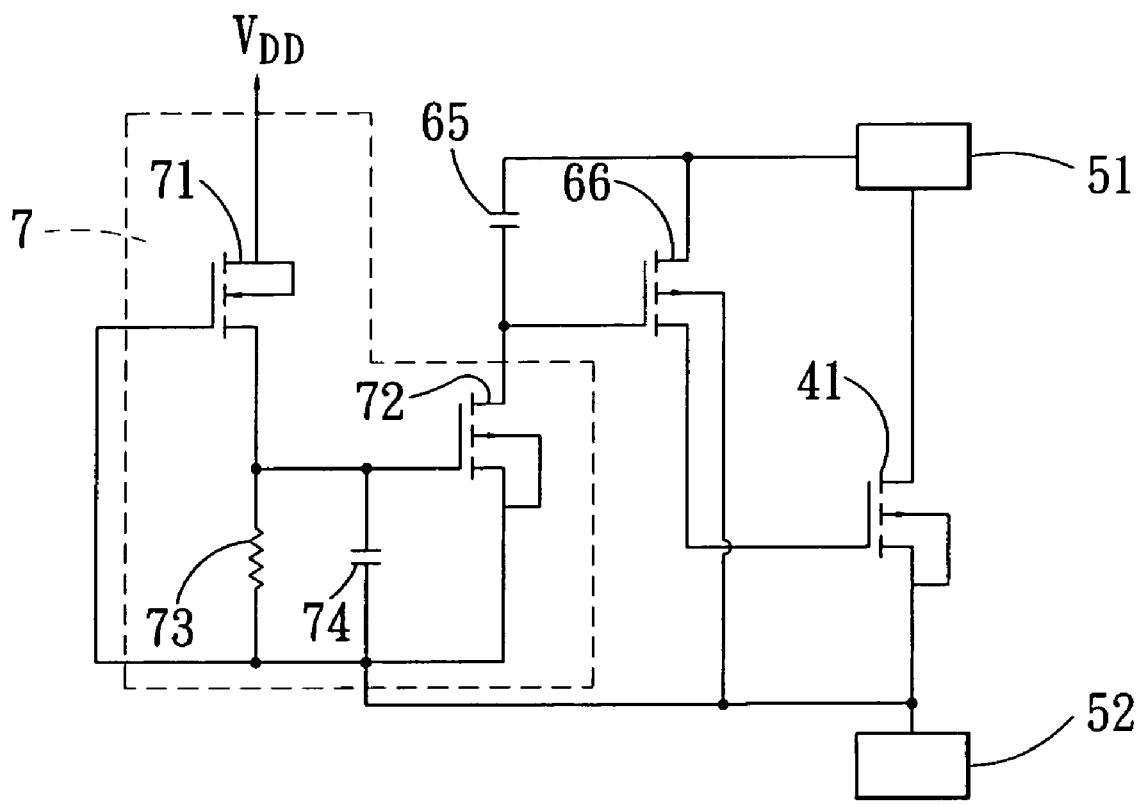
FIG. 14 is a circuit diagram to illustrate a control switch in a further embodiment of this invention modified from the embodiment of FIG. 13 in greater detail.

FIG. 14 illustrates yet another embodiment of this invention modified from that shown in FIG. 13. In this embodiment, the control switch 7 is shown to similarly include a second transistor 71, a third transistor 72, and a resistor 73. The second transistor 71, which is a PMOS transistor in this embodiment, includes a source that receives a supply voltage ($V_{DD}$), a drain, and a gate. The third transistor 72, which is a NMOS transistor in this embodiment, has a gate coupled to the drain of the second transistor 71, a drain coupled to the gate of the first transistor 66, and a source. The resistor 73 is coupled between the source and the gate of the third transistor 72.

In the embodiment of FIG. 14, the second transistor 71 conducts in an activated state of the booster so as to cause the third transistor 72 to conduct and so as to prevent the first transistor 66 from conducting under the normal operating conditions.

Moreover, like the embodiment of FIG. 13, the control switch 7 in FIG. 14 further includes a second capacitor 74 coupled between the gate of the third transistor 72 and the second output pad 52 to prevent shut down of the third transistor 72 due to voltage fluctuation between the first and second output pads 51, 52 under the normal operating conditions.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A booster power management integrated circuit chip, comprising:
    first and second output pads;
    a transistor switch coupled between said first and second output pads, and having a gate; and
    a trigger circuit coupled between said first and second output pads and further coupled to said gate of said transistor switch, said trigger circuit driving said transistor switch to conduct when an instantaneous voltage larger than a trigger voltage level is present between said first and second output pads so as to enable electric current to flow through said transistor switch;

wherein said trigger circuit comprises:

a first transistor having a gate, a drain coupled to said first output pad, and a source coupled to said gate of said transistor switch;

a first capacitor coupled between said first output pad and said gate of said first transistor; and a control switch coupled between said second output pad and said gate of said first transistor;

said control switch forming a closed circuit under normal operating conditions for allowing said first capacitor to charge and for preventing said first transistor from conducting;

the presence of the instantaneous voltage between said first and second output pads upon occurrence of electrostatic discharge causing said first transistor to conduct, thereby triggering conduction of said transistor switch, in view of inability of the voltage state of said first capacitor to change instantaneously.

2. The booster power management integrated circuit chip as claimed in claim 1, wherein said transistor switch includes a metal-oxide-semiconductor (MOS) transistor.

3. The booster power management integrated circuit chip as claimed in claim 2, wherein said MOS transistor is a NMOS transistor having a channel width larger than 10000 μm.

4. The booster power management integrated circuit chip as claimed in claim 1, wherein said control switch includes:

a second transistor having a source, and a gate for receiving an enable signal such that said second transistor has a transistor state dependent upon the enable signal;

a third transistor having a gate coupled to said source of said second transistor, a drain coupled to said gate of said first transistor, and a source; and a resistor coupled between said source and said gate of said third transistor;

a voltage drop across said resistor for causing said third transistor to conduct being generated when said second transistor conducts in response to the enable signal, thereby preventing said first transistor from conducting under the normal operating conditions.

5. The booster power management integrated circuit chips claimed in claim 4, wherein said control switch further includes a second capacitor coupled between said gate of said third transistor and said second output pad so as to prevent shut down of said third transistor due to voltage fluctuation between said first and second output pads under the normal operating conditions.

6. The booster power management integrated circuit chip as claimed in claim 4, wherein each of said first, second and third transistors is a NMOS transistor.

7. The booster power management integrated circuit chip as claimed in claim 1, wherein said control switch includes:

a second transistor having a drain and a gate;

a third transistor having a gate coupled to said drain of said second transistor, a drain coupled to said gate of said first transistor, and a source; and a resistor coupled between said source and said gate of said third transistor;

said second transistor conducting so as to cause said third transistor to conduct and so as to prevent said first transistor from conducting under the normal operating conditions.

8. The booster power management integrated circuit chip as claimed in claim 7, wherein said control switch further includes a second capacitor coupled between said gate of said third transistor and said second output pad so as to prevent shut down of said third transistor due to voltage fluctuation between said first and second output pads under the normal operating conditions.

9. The booster power management integrated circuit chip as claimed in claim 7, wherein each of said first and third transistors is a NMOS transistor, and said second transistor is a PMOS transistor.

* * * * *

UNITED STATES PATENT AND TRADEMARK OFFICE
CERTIFICATE OF CORRECTION

PATENT NO. : 7,436,640 B2  Page 1 of 1
APPLICATION NO. : 11/154175
DATED : October 14, 2008
INVENTOR(S) : Hung-Der Su et al.

It is certified that error appears in the above-identified patent and that said Letters Patent is hereby corrected as shown below:

Title Page; item (73);

On the front page of the patent, please include the "Name of Assignee": as follows:

RICHTEK TECHNOLOGY, CORP.

Residence address:

CHUPEI CITY, HSINCHU, TAIWAN
5F, NO. 20, TAI YUEN STREET
CHUPEI CITY, HSINCHU TAIWAN

Signed and Sealed this

Seventh Day of April, 2009

JOHN DOLL
*Acting Director of the United States Patent and Trademark Office*